United States Patent
Wehner et al.

(10) Patent No.: US 9,305,948 B2
(45) Date of Patent: Apr. 5, 2016

(54) DYNAMIC POLARIZER HAVING MATERIAL OPERABLE TO ALTER ITS CONDUCTIVITY RESPONSIVE TO AN APPLIED STIMULUS

(71) Applicant: RAYTHEON COMPANY, Waltham, MA (US)

(72) Inventors: Justin Gordon Adams Wehner, Goleta, CA (US); Siddhartha Ghosh, Woodland Hills, CA (US)

(73) Assignee: RAYTHEON COMPANY, Waltham, MA (US)

( * ) Notice: Subject to any disclaimer, the term of this patent is extended or adjusted under 35 U.S.C. 154(b) by 145 days.

(21) Appl. No.: 14/291,098

(22) Filed: May 30, 2014

(65) Prior Publication Data

US 2015/0349006 A1    Dec. 3, 2015

(51) Int. Cl.

| | |
|---|---|
| *H01L 27/146* | (2006.01) |
| *G02B 27/28* | (2006.01) |
| *G01J 4/04* | (2006.01) |
| *G02F 1/01* | (2006.01) |
| *H04N 5/225* | (2006.01) |
| *H04N 5/33* | (2006.01) |

(52) U.S. Cl.
CPC ............. *H01L 27/14609* (2013.01); *G01J 4/04* (2013.01); *G02B 27/286* (2013.01); *G02B 27/288* (2013.01); *G02F 1/0136* (2013.01); *H04N 5/2254* (2013.01); *H04N 5/33* (2013.01)

(58) Field of Classification Search
CPC  H01L 27/322; H01L 41/257; H04N 13/0434; H04N 9/3167; G02B 27/286; G02B 27/281; G02B 5/3025

USPC .............. 250/225, 226, 208.1, 216; 345/165, 345/166, 7–9; 359/245, 246; 356/450, 520, 356/498, 497; 348/335, 360, 376

See application file for complete search history.

(56) References Cited

U.S. PATENT DOCUMENTS

| | | | |
|---|---|---|---|
| 8,023,168 B2 | 9/2011 | Hampp et al. | |
| 8,094,361 B2 | 1/2012 | Hampp et al. | |
| 8,842,216 B2 * | 9/2014 | Fest ..................... | H04N 5/2254 348/342 |
| 2011/0267483 A1 | 11/2011 | Kanamori | |

FOREIGN PATENT DOCUMENTS

| | | |
|---|---|---|
| KR | 101395024 B1 | 5/2014 |
| WO | 2006035389 A1 | 4/2006 |

OTHER PUBLICATIONS

Z. Yang et al., "Studies on Electric Triggering of hte Metal-Insulator Transition in VO2 Thin Films Between 22 K and 300 K," Journal of Applied Physics, vol. 110, Aug. 15, 2011, 5 pages.

* cited by examiner

*Primary Examiner* — Que T Le
(74) *Attorney, Agent, or Firm* — Lando & Anastasi, LLP

(57) ABSTRACT

A dynamically controllable polarizer integrated with an imaging detector to provide "on demand" variable polarization measurements. In one example, an imaging system includes a detector array including a plurality of pixels arranged in a two-dimensional array, and a dynamic polarizer coupled to the detector array, the dynamic polarizer including at least one patterned layer of a material disposed on the detector array, the material being operable to alter its conductivity responsive to an applied stimulus to reversibly transition between a polarizing state and a non-polarizing state.

17 Claims, 3 Drawing Sheets

DYNAMIC POLARIZER HAVING MATERIAL OPERABLE TO ALTER ITS CONDUCTIVITY RESPONSIVE TO AN APPLIED STIMULUS

BACKGROUND

Various technologies exist for providing polarized light onto an imaging detector. These techniques include using polarizing filters or wire grids positioned in front of the imaging detector. The filters can be rotated or removed to change the polarization of the light incident on the imaging detector. The wire grids may have uniform orientation over the entire imaging detector array, or may be arranged in "super pixel" blocks, for example. Conventional implementations of polarizers always provide polarization of the light incident on the imaging detector. Only a filter which is physically removed can be "turned off" so as to allow unpolarized light to reach the imaging detector. Alternately, an imaging system may include multiple detectors in combination with beam splitters which may or may not be polarizing themselves. This approach allows for various polarizations and broadband unpolarized measurements to be made sharing the same incident light; however, this approach has a penalty in quantum efficiency and/or size, weight, power and cost.

SUMMARY OF INVENTION

Aspects and embodiments are directed to a polarizer, for example, a polarizing grid, that can be dynamically configured and turned ON and OFF (in the OFF state, allowing broad-band, randomly polarized or unpolarized light to pass through), to allow a wide variety of polarization measurements, as well as broadband spatial imaging, to be performed using a single imaging detector array without requiring moving mechanical parts.

According to one embodiment, an imaging system comprises a detector array including a plurality of pixels arranged in a two-dimensional array, and a dynamic polarizer coupled to the detector array, the dynamic polarizer including at least one patterned layer of a material disposed on the detector array, the material being operable to alter its conductivity responsive to an applied stimulus to reversibly transition between a polarizing state and a non-polarizing state.

In one example, the imaging system further includes a voltage source coupled to the dynamic polarizer, wherein the applied stimulus is a voltage supplied by the voltage source. In one example, the at least one patterned layer of the material is patterned into a polarizing grid having a quad super-pixel structure aligned with the plurality of pixels of the detector array. In another example, the at least one patterned layer of the material is patterned into features having a sub-pixel sized feature pitch. In one example, the material is one of vanadium dioxide and/or germanium. In another example, the material is an electrochromic polymer. In one example, the at least one layer of the material is a thin film coating disposed on the detector array. In one example, the material is substantially transparent to infrared light in the non-polarizing state, and is substantially opaque to infrared light in the polarizing state. The imaging system may further include a stimulus source coupled to the dynamic polarizer and configured to produce the applied stimulus, and a controller coupled to the stimulus source, wherein the at least one patterned layer of the material includes a first patterned structure disposed over a first region of the detector array, and a second patterned structure disposed over a second region of the detector array, and wherein the controller is configured to control the stimulus source to selectively apply the applied stimulus to the first and second patterned structures individually. In one example, the stimulus source is a voltage source, and the applied stimulus is an applied voltage. The imaging system may further include a read-out integrated circuit coupled to the detector array, wherein the controller is further coupled to the read-out integrated circuit. In one example, the dynamic polarizer is a first dynamic polarizer, and the imaging system further includes a second dynamic polarizer positioned over the first dynamic polarizer and the detector array, at least one stimulus source coupled to the first and second dynamic polarizers and configured to produce the applied stimulus, and a controller coupled to the at least one stimulus source and configured to control the at least one stimulus source to selectively apply the applied stimulus to the first and second dynamic polarizers individually.

According to another embodiment, an imaging method includes receiving broad-band randomly polarized light at an imaging device that includes a detector array and a patterned layer of material disposed over the detector array, selectively applying a stimulus to the patterned layer of material to reversibly transition the patterned layer of material between a polarizing state and a non-polarizing state, when the patterned layer of material is in the polarizing state, receiving polarized light at the detector array and performing polarimetry with the detector array, and when the patterned layer of material is in the non-polarizing state, receiving the broad-band randomly polarized light at the detector array and performing broad-band imaging with the detector array.

In one example of the imaging method, selectively applying the stimulus to the patterned layer of material is performed on a frame-by-frame basis. In another example, selectively applying the stimulus to the patterned layer of material includes selectively applying a voltage to the patterned layer of material. In one example, the broad-band randomly polarized light is infrared light, and selectively applying the stimulus transitions the patterned layer of material between an infrared opaque state, corresponding to the polarizing state, and an infrared transparent state, corresponding to the non-polarizing state. In another example, selectively applying the stimulus includes selectively applying the stimulus to a first region of the patterned layer of material, and independently selectively applying the stimulus to a second region of the patterned layer of material.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
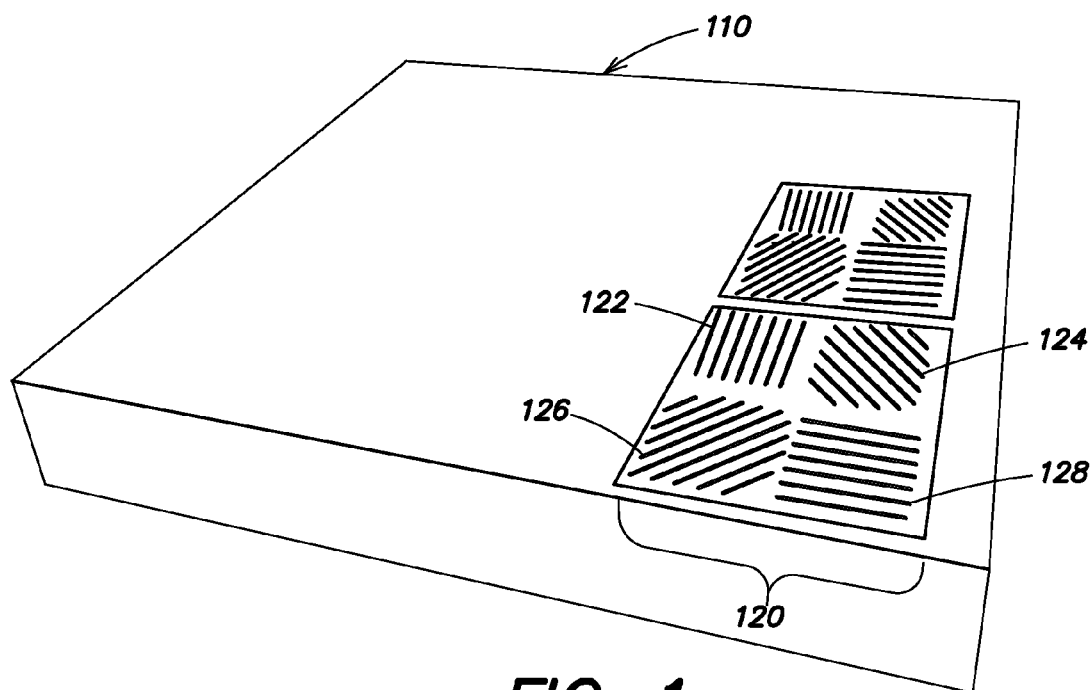
FIG. 1 is a block diagram of one example of a detector array including a dynamic polarizer according to aspects of the present invention.

Polarizing grids are relatively well understood devices, and can either be contiguous uniform grids, or patterned into small sub-pixel arrays. However, for broad-band imaging that does not require polarization information, having the polarizing grid positioned in front of the imaging detector is very inefficient because the grid discards all light that is not of the requisite polarization. As a result, users of conventional systems that want both polarization and broad-band have to introduce and remove the polarizing grid, for example, by using a rotating filter wheel. In certain applications of imaging systems, it may be desirable to provide polarization information on a frame by frame basis. Conventional physically moving filter wheels with polarization grids are generally too slow and complex to fulfill this need. Additionally, it may be desirable to dynamically provide polarization in sub-regions of an imaging array, and broad-band measurements elsewhere, with the ability to move the region of interest over the array. Conventional polarizing grids are generally incompatible with such dynamically variable sub-pixel approaches.

Aspects and embodiments are directed to a dynamic polarizer, that is, one that can be turned ON and OFF, and/or reconfigured to pass different polarization states, "on demand." In particular, aspects and embodiments are directed to a dynamic polarizer that is capable of being turned ON and OFF with an applied stimulus, for example, an applied voltage, as discussed further below. According to one embodiment, the polarizer is patternable and may be applied in full field or sub-regions of an imaging array as configured by the electrical contacts. This approach replaces the fixed polarizer of conventional systems for a dynamic polarizer, and time division multiplexes between providing polarization and broad-band unpolarized light to the imaging array. Embodiments of the dynamic polarizer may be sufficiently rapidly reconfigurable to allow polarization to be applied on a frame by frame basis. Furthermore, certain embodiments provide the capability to dynamically provide polarization information in only a small region of the imaging array, as needed, maintaining high quantum efficiency elsewhere.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Referring to FIG. 1, there is illustrated a block diagram of one example of a detector array including a patterned dynamic polarizer according to one embodiment. The detector array 110 may be a focal plane array, for example. The detector array 110 includes a two-dimensional array of pixels that are configured to receive incident electromagnetic radiation from a scene and to produce electrical signals that may be used to create an image of the scene. As is well understood by those skilled in the art, the detector array 110 may be comprised of several layers of semiconductor materials and electrically conductive materials (e.g., metals) patterned to form the array of pixels, each pixel having associated electrical contacts to allow the respective electrical signals produced in response to the received electromagnetic radiation to be read out by or provided to control and processing circuitry. In one example, the detector array 110 is an infrared detector, configured to receive and be responsive to infrared light in any one or more infrared spectral bands, including, for example, the near-infrared, short-wave infrared (SWIR, generally including wavelengths in the range of about 1.4-3 micrometers ($\mu$m)), mid-wave infrared (MWIR, generally including wavelengths in the range of about 3-8 $\mu$m), and long-wave infrared (LWIR, generally including wavelengths in the range of about 8-15 $\mu$m).

According to one embodiment, the dynamic polarizer may be integrated with such a detector array, and implemented as one or more layers of material disposed on and/or between layers of the detector array 110. The dynamic polarizer may be patterned into a polarizing grid, as illustrated in FIG. 1. In the example shown in FIG. 1, the dynamic polarizer is patterned into a quad "super-pixel" structure. Each super-pixel 120 of the polarizing grid includes four individual pixel patterns 122, 124, 126, and 128. The super-pixel structure is repeated over the entire detector array 110, or over a portion of the array. The individual pixel patterns 122, 124, 126, and 128 may be aligned with pixels of the detector array 110.

Figure 2:
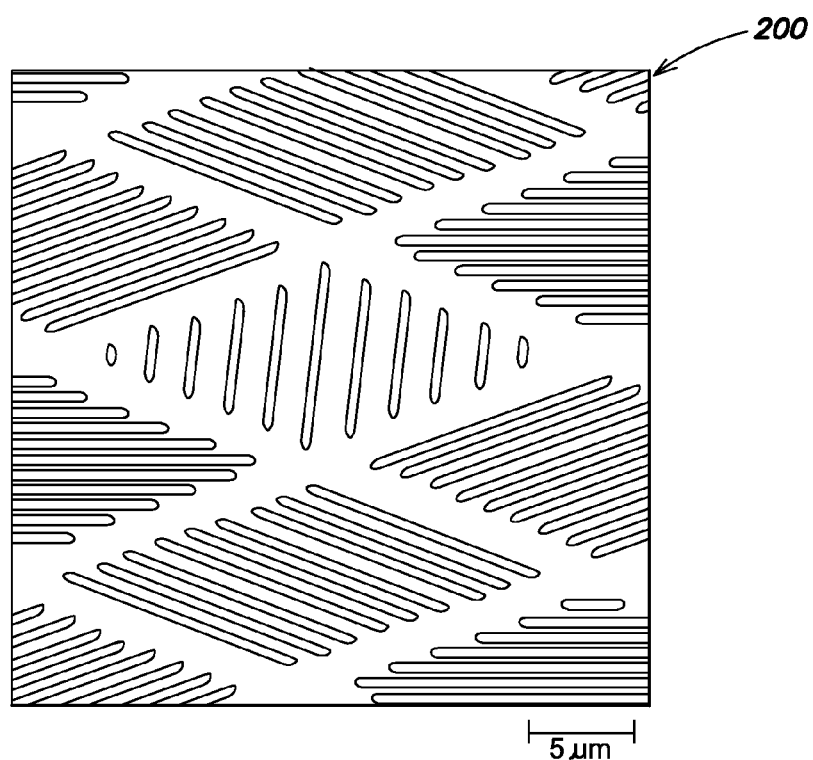
FIG. 2 is an illustration of one example of patterned dynamic polarizer according to aspects of the invention.

FIG. 2 is an illustration of one example of a patterned dynamic polarizing grid 200 according to one embodiment. The material of the polarizing grid 200 may be patterned onto one or more layers of the underlying detector array 110 using any of several known techniques. For example, the material may be deposited in the desired pattern, or may be deposited or spin-coated and then patterned, e.g., using etching, photolithography, or other well known techniques. In one example, the polarizing grid 200 may include one or more thin film layers of material on the detector array 110. Although the dynamic polarizer is illustrated in FIGS. 1 and 2 as having a repeating quad super-pixel grid pattern, in other embodiments, the polarizer may have different patterns, which may be uniform across the detector array 110, or a portion thereof, or may vary over different regions of the detector array, and which may or may not be distributed in a pixel-by-pixel arrangement.

As discussed above, the dynamic polarizer is capable of being turned ON and OFF with an applied stimulus, such that the polarizing function can be enabled and disabled on demand over any region of the detector array 110. In particular, according to one embodiment, the dynamic polarizer includes one or more layers of material that change their electrical conductivity responsive to an applied stimulus, such as an applied current, voltage, electric field, or magnetic field. The layers of material are patterned into a polarizing grid, as illustrated in FIGS. 1 and 2, for example. In the ON state, the layer(s) are conductive, and thus perform polarizing, similar to a conventional polarizing wire grid, for example. In the OFF state, the layer(s) are transparent to the incident electromagnetic radiation. Thus, by selectively applying the stimulus, the dynamic polarizer can be turned ON and OFF, thereby allowing the detector array 110 to perform both polarimetry (when the polarizer is ON) and broad-band imaging (when the polarizer is OFF).

There are numerous materials, including organic materials and semiconductor materials, that have one or more physical properties that change with the application of a stimulus to the material. Organic materials may comprise polymers or oligomers in certain embodiments. Polymers may be comprised of repeating structural units. The structure of any given polymer may have an influence on its properties. An external stimulus applied to a polymer may alter a physical property of the polymer and/or the geometric arrangement of atoms or groups of atoms in a polymer. Conjugated electrochromic polymers, also known as conduction polymers, electro-active polymers or semiconducting polymers, and certain semiconductors, such as Germanium (Ge) and Vanadium Dioxide ($VO_2$), are examples of materials that may change their electrical conductivity in response to an applied stimulus, and which may therefore be used to form a dynamic polarizer according to certain embodiments. These materials may be operable to be electrically switched reversibly from an IR transparent state that transmits infrared light to an IR opaque state that does not transmit infrared light, and back. For example, the materials may be IR transparent at certain doping or carrier levels, and IR opaque at other doping or carrier levels. In some embodiments, doping or carrier levels of conjugated electrochromic polymers, Ge, or $VO_2$ may cause the materials to be or act as metals when they are in the IR opaque state. The doping or carrier levels may be controlled or varied through the applied stimulus. Thus, in the IR opaque, or ON, state, the polarizing grid formed of such materials appears and acts similar to a conventional metal wire polarizing grid. However, in the OFF state, the material is IR transparent, and thus does not perform a polarizing function, allowing the underlying detector array 110 to perform broad-band imaging.

Figure 3:
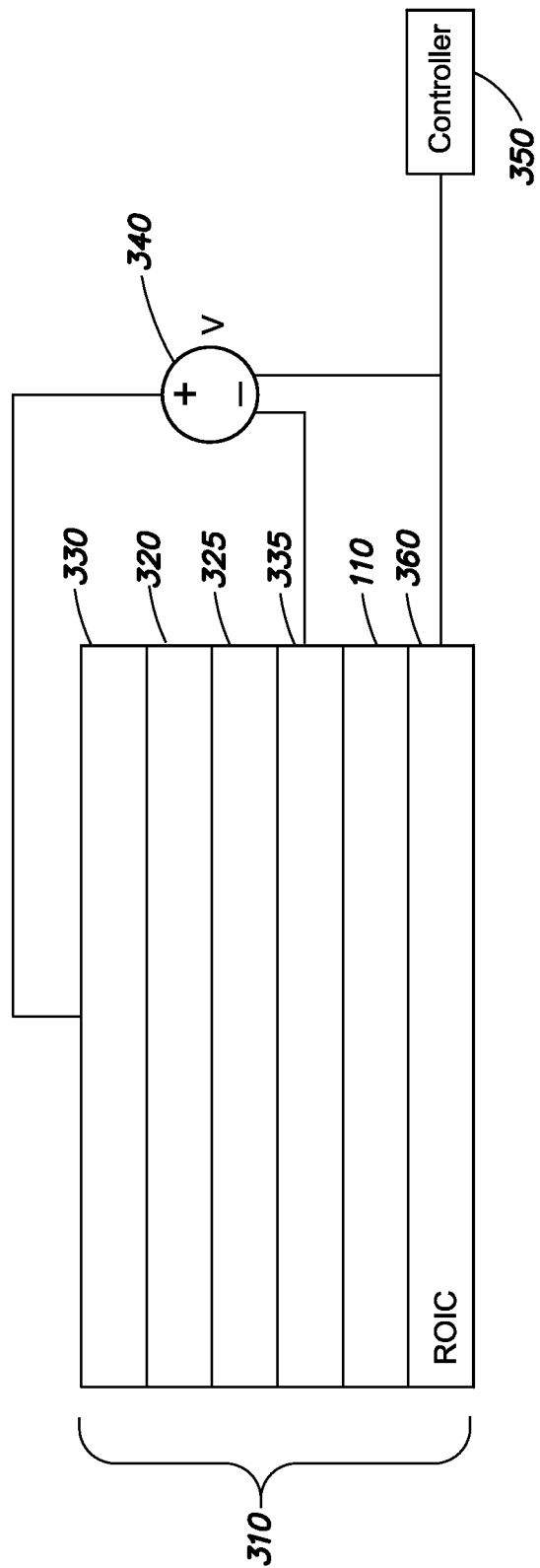
FIG. 3 is a block diagram of one example of an imaging detector including a dynamic polarizer according to aspects of the invention.

Electrochromic polymer based or semiconductor based dynamic polarizers may be easily incorporated (e.g. by coating as discussed above) onto existing IR technology platforms and provide an ease of operability for a wide range of infrared technology applications. FIG. 3 illustrates, schematically, a representation of an IR detector system including a layered structure having multiple layers comprised of one or more materials. In some embodiments, one or more layers may be uniform layers having substantially one type of material. In other embodiments, one or more layers may be combination layers having more than one material together in the layer. In some embodiments, a layer may be a film (e.g., a film of a conjugated electrochromic polymer used to form a dynamic polarizer, as discussed above).

Referring to FIG. 3, in one example, the imaging device 310 includes a detector array 110 which may include a two-dimensional array of pixels, as discussed above. Although detector array 110 is illustrated schematically in FIG. 3 as a single layer, those skilled in the art will appreciate that the detector array may include multiple layers of the same and different materials, as may be needed to form the pixels of the array. Additionally, the detector array 110 may be coupled to an associated read-out integrated circuit (ROIC) 360. The imaging device 310 may further include one or more layers of material 320, 325 that are patterned to form a dynamic polarizer, as discussed above. In some embodiments, electrically conducting layers 330 and/or 335 may function as electrodes in the imaging device 310 that are coupled to the dynamic polarizer layers 320, 325 and allow an electrical stimulus to be applied to the dynamic polarizer layers. For example, changing the potential or voltage across electrodes 330, 335 by application of an external voltage from voltage source 340 may cause changes in the conductivity (e.g., by changing the doping or carrier levels) in a conjugated electrochromic polymer or semiconductor comprised in layer(s) 320 and/or 325, causing a change in IR transparency of the material, as discussed above.

It is to be appreciated that although the electrode layers 330, 335 are illustrated in FIG. 3 on either side of the stacked layers of the detector array 110 and dynamic polarizer layers 320, 325, embodiments may be arranged differently, and the electrode layers may be interspersed with any of the layers 110, 320, and/or 325. Additionally, although layers 320 and 325 are illustrated positioned above the detector array 110, in other embodiments, the dynamic polarizer may include only one layer 320 or 325, or more than two layers, and any of the layers making up the dynamic polarizer may be interspersed or sandwiched with layers making up the detector array 110. Furthermore, any or all of the layers 320, 325, 330, and/or 335, as well as any of the layers making up the detector array 110, may be discontinuous/patterned (for example, as illustrated in FIG. 2, where the dynamic polarizer 200 includes a patterned layer of material). Accordingly, FIG. 3 is intended as a schematic illustration only, and not a physical implementation.

As an example, as positive voltages are applied across electrically active conjugated electrochromic polymers in layer(s) 320, 325, polymers may be oxidized, leaving lone pairs of electrons in the pi orbitals of the polymer chain. These lone pairs of electrons may introduce states into the bandgap, and may change doping or carrier levels of a conjugated electrochromic polymer, resulting in a semiconductor/insulator to conductor transition of the polymer and optically from an infrared transparent to an infrared opaque transition. Positively charged defect states that may be created on a conjugated electrochromic polymer backbone by a doping process may exist in many different forms, such as polarons (coupled radical cations), bipolarons (coupled di-cations) and/or solitons (non-interacting cations). These charged defect states may, in some embodiments, serve as charge carriers in a conjugated electrochromic polymeric system and may be responsible for changes in doping or carrier levels and the electrically conductive nature of the polymer. Similarly, application of a voltage stimulus to a thin film layer of $VO_2$ or Ge may change the resistance of the material, reversibly reconfiguring the material between a semiconducting or insulating phase and a "metallic" phase. When the material is patterned, these changes also allow the device to perform polarization functions as the added carriers are able to move in the presence of the incident electromagnetic radiation and effect one polarization selectively, and not others. Studies have shown that the transition time between the IR transparent and IR opaque states of a layer of $VO_2$, Ge, or an electrochromic polymer is very rapid, for example, less than one second.

Thus, by incorporating one or more layers of an electrically controllable material into an imaging device, a dynamic polarizer can be integrated with an imaging detector array 110. A controller 350 may be coupled to the stimulus source, for example, the voltage source 340, as illustrated in FIG. 3, and configured to control the source to selectively apply the stimulus to the polarizer layers 320 and/or 325, or region(s) thereof. The controller 350 may include any suitable mechanism for controlling the stimulus source to selectively apply the stimulus to control operation of the dynamic polarizer, such as a machine, computer system, microprocessor, electronic or optical circuit, or any other device. Although the example of FIG. 3 depicts the controller 350 as physically separate from the imaging device 310, the controller 350 could be integrated within the imaging device 310 (e.g., formed in one or more layers of the read-out integrated circuit 360. The controller 350 may be further configured to receive and process signals from the read-out integrated circuit 360 to produce images from the responses of the detector array 110 to incident electromagnetic radiation, as will be understood and appreciated by those skilled in the art.

In one example, layer 320 includes a material, such as an electrochromic polymer, Ge, $VO_2$, or $VO_x$, patterned to form a first polarizing grid over a least a first portion of the detector array 110. For example, layer 320 may be patterned with a quad super-pixel structure, as illustrated in FIGS. 1 and 2, and aligned over at least some of the pixels of the detector array 110. In one example, the electrode layers 330, 335 are configured such that the entire polarizing grid formed by layer 320 is turned ON or OFF responsive to the applied stimulus. In other examples, the electrode layers 330, 335 may be patterned such that regions of the polarizing grid formed by layer 320 may be individually turned ON and OFF responsive to the applied stimulus. In one example, the layer 320 may be patterned into a pixelated structure aligned with the pixels of the detector array 110, and the electrode layers 330, 335 may be patterned such that the regions of layer 320 corresponding to each pixel of the array may be individually "addressable" (i.e., individually able to be turned ON and OFF responsive to the applied stimulus). As discussed above, in some embodiments, the dynamic polarizer includes only a single patterned layer of material, such as layer 320, for example. In other embodiments, the dynamic polarizer includes multiple patterned layers of material, such as layers 320 and 325, and optionally additional layers.

In one example in which the dynamic polarizer includes layers 320 and 325, the two layers may be patterned with the same or different structures. For example, layer 320 may be patterned with a quad super-pixel structure that separate orthogonal linear polarizations, as illustrated in FIGS. 1 and 2, and layer 325 may be patterned with a super-pixel structure configured to separate orthogonal circular polarizations, or vice versa. In another example, the two layers 320, 325 may be disposed over different regions of the detector array 110, and may be configured for different wavelength bands. In some embodiments, the layer 320 or 325 may be patterned with a sub-wavelength feature spacing (e.g., sub-wavelength spacing between lines of material forming the polarizing grid) at a wavelength of interest. In another example, the layer 320 and/or 325 may be patterned in regions that have sub-pixel pitch sizes, rather than being aligned on the pixel pitch, so as to allow for dynamically adjusting the polarizing grid orientation. Individual features (e.g., lines or groups of lines) of the polarizer may be individually addressable through the electrode layers 330, 335, such that the apparent pattern of the polarizer (i.e., the pattern that is "seen" by the incident light when the polarizer is in the ON state) may be dynamically configurable under the control of the controller 350.

Figure 4:
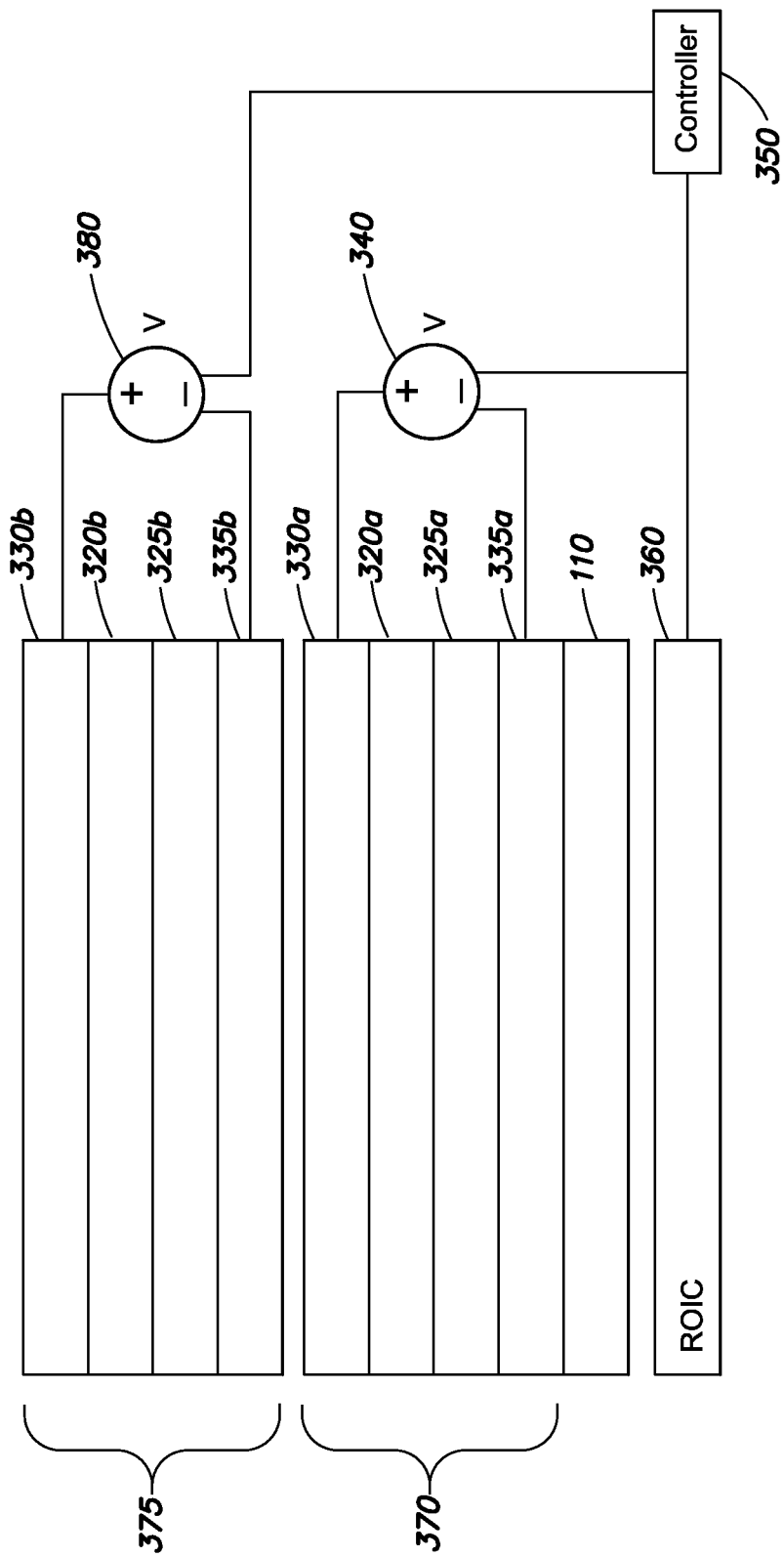
FIG. 4 is a block diagram of another example of an imaging detector including two dynamic polarizers according to aspects of the invention.

Referring to FIG. 4, there is illustrated another example of an imaging system including multiple individually addressable dynamic polarizers or dynamic polarizing regions. In this example, an imaging device includes a first dynamic polarizer 370 including electrode layers 330a and 335a coupled to polarizing layers 320a and 325a, and a second dynamic polarizer 375 including electrode layers 330b and 335b coupled to polarizing layers 320b and 325b. A first stimulus source (e.g., a voltage source) 340 is coupled to the first dynamic polarizer, and a second stimulus source 380 (e.g., a second voltage source) is coupled to the second dynamic polarizer. Both stimulus sources 340, 380 may be individually controlled by the controller 350 to activate or deactivate the respective polarizing functions. In one example, the layers 320a, 320b, 325a, and 325b are different layers of material, as discussed further below. In another example, layers 320a and 320b are different regions of layer 320 discussed above, and layers 325a and 325b are different regions of layer 325 discussed above. Accordingly, FIG. 4 is intended as a schematic illustration only that represents the concept of multiple individually addressable polarizing elements, and not necessarily a physical implementation.

In one example, the imaging system may include "stacks" of two or more dynamic polarizers 370, 375 positioned on top of one another over the underlying detector array 110, as shown schematically in FIG. 4. In such an example, the controller 350 may control the respective stimulus sources 340, 380 for time division multiplexing of a uniform underlying detector array, as an alternative to the spatial multiplexing of "quads" of super-pixels discussed above. For example, the first and second dynamic polarizers 370, 375 may be patterned differently to pass different polarizations, such that the underlying detector array 110 receives one polarization when the first dynamic polarizer is ON and the second dynamic polarizer is OFF, and receives a different polarization when the first dynamic polarizer is OFF and the second dynamic polarizer is ON. In one example, the two dynamic polarizers 370, 375 are configured with cross-polarizing layers, such that when both polarizers are ON, no light is passed to the underlying detector array 110, thereby providing a controllable shuttering effect.

As discussed above, the stimulus may be applied to turn the polarizer ON and OFF on a frame by frame basis. Thus, the imaging device 310 may be configured to obtain frames of polarimetry data interspersed with frames of broad-band imaging data. In the example illustrated in FIGS. 3 and 4, the stimulus source is the voltage source 340 (and 380 in FIG. 4) that applies a voltage to the dynamic polarizer layers 320/325 via the electrode layers 330 and 335. However, as discussed above, the stimulus need not be a voltage, and may instead be a current, magnetic field, or optical flux, for example. Accordingly, in other embodiments, the voltage source 340 may be replaced with a suitable current source, magnetic field generator, or optical source (e.g., producing optical flux at a wavelength other than the wavelength(s) used for imaging by the detector array 110).

Thus, aspects and embodiments provide a polarizing grid that is dynamic and can be configured to allow broad-band randomly polarized light through in an OFF state perform polarizing functions in an ON state. The transition between polarizing and non-polarizing states may be accomplished on demand, over dynamically selectable localized regions of the detector array, and using an electrical or other applied stimulus, without the need for moving mechanical parts. In contrast, conventional architectures focus on the use of a fixed polarizing grid, generally of metal wires, that is always on, or a polarizing element that is physically removable from the beam path. As discussed above, a dynamic polarizer according to various embodiments includes one or more thin films or layers of a material that can switch rapidly from an insulator-like transparent infrared light emitting (non-polarizing) state to a metal-like opaque infrared light blocking (polarizing) state. This layer or layers of material can be integrated with a detector array to provide an imaging system that is capable of providing on demand polarimetry and broad-band imaging.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An imaging system comprising:
    a detector array including a plurality of pixels arranged in a two-dimensional array; and
    a dynamic polarizer coupled to the detector array, the dynamic polarizer including at least one patterned layer of a material disposed on the detector array, the material being operable to alter its conductivity responsive to an applied stimulus to reversibly transition between a polarizing state and a non-polarizing state.

2. The imaging system of claim 1, further comprising a voltage source coupled to the dynamic polarizer, wherein the applied stimulus is a voltage supplied by the voltage source.

3. The imaging system of claim 1, wherein the at least one patterned layer of the material is patterned into a polarizing grid having a quad super-pixel structure aligned with the plurality of pixels of the detector array.

4. The imaging system of claim 1, wherein the at least one patterned layer of the material is patterned into features having a sub-pixel sized feature pitch.

5. The imaging system of claim 1, wherein the material is one of vanadium dioxide and germanium.

6. The imaging system of claim 1, wherein the material is an electrochromic polymer.

7. The imaging system of claim 6, wherein the at least one layer of the material is a thin film coating disposed on the detector array.

8. The imaging system of claim 1, wherein the material is substantially transparent to infrared light in the non-polarizing state, and is substantially opaque to infrared light in the polarizing state.

9. The imaging system of claim 1, further comprising:
    a stimulus source coupled to the dynamic polarizer and configured to produce the applied stimulus; and
    a controller coupled to the stimulus source;
    wherein the at least one patterned layer of the material includes a first patterned structure disposed over a first region of the detector array, and a second patterned structure disposed over a second region of the detector array; and
    wherein the controller is configured to control the stimulus source to selectively apply the applied stimulus to the first and second patterned structures individually.

10. The imaging system of claim 9, wherein the stimulus source is a voltage source, and the applied stimulus is an applied voltage.

11. The imaging system of claim 9, further comprising a read-out integrated circuit coupled to the detector array, wherein the controller is further coupled to the read-out integrated circuit.

12. The imaging system of claim 1, wherein the dynamic polarizer is a first dynamic polarizer; and the imaging system further comprises:
    a second dynamic polarizer positioned over the first dynamic polarizer and the detector array;
    at least one stimulus source coupled to the first and second dynamic polarizers and configured to produce the applied stimulus; and
    a controller coupled to the at least one stimulus source and configured to control the at least one stimulus source to selectively apply the applied stimulus to the first and second dynamic polarizers individually.

13. An imaging method comprising:
    receiving broad-band randomly polarized light at an imaging device that includes a detector array and a patterned layer of material disposed over the detector array;
    selectively applying a stimulus to the patterned layer of material to reversibly transition the patterned layer of material between a polarizing state and a non-polarizing state;
    when the patterned layer of material is in the polarizing state, receiving polarized light at the detector array and performing polarimetry with the detector array; and
    when the patterned layer of material is in the non-polarizing state, receiving the broad-band randomly polarized light at the detector array and performing broad-band imaging with the detector array.

14. The imaging method of claim 13, wherein selectively applying the stimulus to the patterned layer of material is performed on a frame-by-frame basis.

15. The imaging method of claim 13, wherein selectively applying the stimulus to the patterned layer of material includes selectively applying a voltage to the patterned layer of material.

16. The imaging method of claim 15, wherein the broad-band randomly polarized light is infrared light, and wherein selectively applying the stimulus transitions the patterned layer of material between an infrared opaque state, corresponding to the polarizing state, and an infrared transparent state, corresponding to the non-polarizing state.

17. The imaging method of claim 13, wherein selectively applying the stimulus includes:
    selectively applying the stimulus to a first region of the patterned layer of material; and
    independently selectively applying the stimulus to a second region of the patterned layer of material.

* * * * *